(12) United States Patent
Rastogi et al.

(10) Patent No.: US 12,136,918 B2
(45) Date of Patent: Nov. 5, 2024

(54) DRIVER SYSTEM FOR REDUCING COMMON MODE NOISE DUE TO MISMATCHES IN DIFFERENTIAL SIGNAL PATH

(71) Applicant: Texas Instruments Incorporated, Dallas, TX (US)

(72) Inventors: Srijan Rastogi, Bangalore (IN); Sumantra Seth, Bangalore (IN); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/872,841

(22) Filed: Jul. 25, 2022

(65) Prior Publication Data

US 2024/0030900 A1 Jan. 25, 2024

(51) Int. Cl.
*H03F 3/45* (2006.01)
*H03K 3/01* (2006.01)

(52) U.S. Cl.
CPC .......... *H03K 3/01* (2013.01); *H03F 3/45475* (2013.01); *H03F 3/45479* (2013.01); *H03F 3/45488* (2013.01)

(58) Field of Classification Search
CPC ... H03K 3/01; H03F 3/45475; H03F 3/45479; H03F 3/45488; H03F 2203/45424; H03F 2203/45434; H03F 2203/45442; H03F 2203/45446

See application file for complete search history.

(56) References Cited

U.S. PATENT DOCUMENTS

2014/0218113 A1* 8/2014 Wang ................. H03H 11/1217
330/254

* cited by examiner

Primary Examiner — Jung Kim
(74) Attorney, Agent, or Firm — John R. Pessetto; Frank D. Cimino

(57) ABSTRACT

A driver system includes a non-inverting system input, an inverting system input, a non-inverting system output and an inverting system output. The driver system includes a line driver which includes a non-inverting driver input coupled to the non-inverting system input and includes an inverting driver input coupled to the inverting system input. The line driver includes an inverting driver output and a non-inverting driver output. The driver system includes a first termination resistor coupled between the non-inverting driver output and the non-inverting system output and includes a second termination resistor coupled between the inverting driver output and the inverting system output. The driver system includes a first amplifier stage coupled to the line driver and includes a second amplifier stage coupled to the line driver.

18 Claims, 4 Drawing Sheets

DRIVER SYSTEM FOR REDUCING COMMON MODE NOISE DUE TO MISMATCHES IN DIFFERENTIAL SIGNAL PATH

TECHNICAL FIELD

This description relates generally to systems for reducing common mode noise in electronic circuits, and more particularly to a driver system which reduces common mode noise due to mismatches in a differential signal path.

BACKGROUND

In electronic circuits, common mode noise may be present in a differential signal path (also referred to as a transmission line). A transmitting device (e.g., logic circuit, computer) may be coupled to a receiving device (e.g., logic circuit, computer) by a transmission line (e.g., two-wire differential signal path, differential microstrip pair, twisted pair cable). A line driver may be used as an interface to enable communication between the transmitting device and the receiving device. Generally, a "line driver" may be an amplifier circuit, a high-speed transmitter or a buffer used to enable high speed communication between the transmitting device and the receiving device. The line driver drives a circuitry to transmit a differential signal to the receiving device via a transmission line. Due to a mismatch or an asymmetry in the differential signal path, common mode noise may be present.

Electronic circuits are generally susceptible to common mode noise. Common mode noise tends to be higher in frequency (e.g., around 150 MHz and greater) than other forms of noise, and, thus, common mode noise may radiate from one circuit to a nearby circuit and may cause unintentional electromagnetic interference (EMI). Radiated EMI may be "received" by data lines or by unshielded twisted pair (UTP) wiring (sometimes referred to as "crosstalk"). As used herein, "crosstalk" may generally refer to the unintentional electromagnetic coupling between two conductors or between traces on a printed circuit board (PCB). Common mode noise may increase differential crosstalk in differential signal paths, and it may also enter circuits through a common potential (e.g., ground). Typical effects of EMI due to common mode noise may include signal integrity degradation, intermittent reboots and lockups of computers and data transfer errors. If common mode noise is large enough, component failure is possible.

In most applications, to meet electromagnetic compliance (EMC) standards for electronic circuits and to ensure components and systems do not emit excessive, unintentional EMI (which may interfere with the operation of other systems), it is generally necessary to attenuate any EMI below 9.0 dB (e.g., at around 150 MHz). However, a 1.25% mismatch in a differential signal path may result in 20 dB EMI which greatly exceeds EMC standards. This type of mismatch may occur in designs where a transmitter is implemented in a packaged semiconductor device that is connected through printed circuit board traces to a cable that is connected to an external device. The mismatches may occur at the interfaces between: the semiconductor device and the printed circuit board traces; the printed circuit board traces and the cable; and the cable and the external device.

In some electronic circuits, common mode chokes (CMC) are coupled to the transmission line to suppress EMI. Also, improved shielding may be added to the transmission line to suppress EMI. However, such techniques may not be readily available in designs where the transmission lines are implemented using conductor traces on a substrate (such as a printed circuit board).

SUMMARY

In one aspect, a driver system includes a non-inverting system input, an inverting system input, a non-inverting system output and an inverting system output. The driver system includes a line driver which includes a non-inverting driver input coupled to the non-inverting system input and includes an inverting driver input coupled to the inverting system input. The line driver includes an inverting driver output and a non-inverting driver output. The driver system includes a first termination resistor coupled between the non-inverting driver output and the non-inverting system output. The driver system includes a second termination resistor coupled between the inverting driver output and the inverting system output. The driver system includes a first amplifier stage coupled to the line driver and includes a second amplifier stage coupled to the line driver.

In an additional aspect, the first amplifier stage includes an inverting input coupled to the inverting driver output and the non-inverting driver output and includes a non-inverting input adapted to be coupled to a reference voltage source.

In an additional aspect, the first amplifier stage includes an inverting output coupled to the non-inverting driver output and includes a non-inverting output coupled to the inverting driver output.

In an additional aspect, the second amplifier stage includes an inverting input coupled to the inverting input of the first amplifier stage and includes a non-inverting input coupled to the non-inverting system output and the inverting system output.

In an additional aspect, the inverting input of the second amplifier stage is coupled to the inverting input of the first amplifier stage via a first capacitor, and the non-inverting input of the second amplifier stage is coupled to the non-inverting system output and the inverting system output via a second capacitor. The second amplifier stage includes an inverting output coupled to the non-inverting driver output and includes a non-inverting output coupled to the inverting driver output.

In an additional aspect, the inverting output of the second amplifier stage is coupled to the non-inverting driver output via a third capacitor, and the non-inverting output of the second amplifier stage is coupled to the inverting driver output via a fourth capacitor.

In an additional aspect, a first compensation capacitor is coupled between the non-inverting driver input and the non-inverting driver output, and a second compensation capacitor coupled between the inverting driver input and the inverting driver output.

In an additional aspect, a first compensation resistor is coupled between the non-inverting driver input and the non-inverting driver output, and a second compensation resistor coupled between the inverting driver input and the inverting driver output.

In an additional aspect, the first amplifier stage has a low bandwidth, and the second amplifier stage has a high bandwidth.

In an additional aspect, a driver system includes a non-inverting system input, an inverting system input, a non-inverting system output and an inverting system output. The driver system includes a line driver which includes a non-inverting driver input coupled to the non-inverting system input and includes an inverting driver input coupled to the inverting system input. The line driver includes a non-inverting driver output and an inverting driver output. The driver system includes a first termination resistor coupled between the non-inverting driver output and the non-inverting system output and includes a second termination resistor coupled between the inverting driver output and the inverting system output. The driver system includes a first amplifier stage configured to bias a DC voltage across the non-inverting and inverting driver outputs. The driver system includes a second amplifier stage configured to minimize a voltage difference between a first common mode voltage and a second common mode voltage. The first common mode voltage is a voltage across the non-inverting driver output and the inverting driver output, and the second common mode voltage is a voltage across the non-inverting system output and the inverting system output.

In an additional aspect, a driver system includes a non-inverting system input, an inverting system input, a non-inverting system output and an inverting system output. The driver system includes a line driver which includes a non-inverting driver input coupled to the non-inverting system input and includes an inverting driver input coupled to the inverting system input. The line driver includes an inverting driver output and a non-inverting driver output. The driver system includes a first termination resistor coupled between the non-inverting driver output and the non-inverting system output and includes a second termination resistor coupled between the inverting driver output and the inverting system output. The driver system includes a first amplifier stage which includes a non-inverting input adapted to be coupled to a reference voltage source and includes an inverting input coupled to the non-inverting driver output and the inverting driver output. The first amplifier stage includes a non-inverting output coupled to the inverting driver output and includes an inverting output coupled to the non-inverting driver output. The driver system includes a second amplifier stage which includes a non-inverting input coupled to the non-inverting system output and the inverting system output via a first capacitor and includes an inverting input coupled to the non-inverting driver output and the inverting driver output via a second capacitor. The second amplifier stage includes a non-inverting output coupled to the inverting driver output via a third capacitor and includes an inverting output coupled to the non-inverting driver output via a fourth capacitor.

BRIEF DESCRIPTION OF THE DRAWINGS

The same reference numerals or other feature designators are used in the drawings to designate the same or similar (functionally and/or structurally) features.

DETAILED DESCRIPTION

Figure 1A:
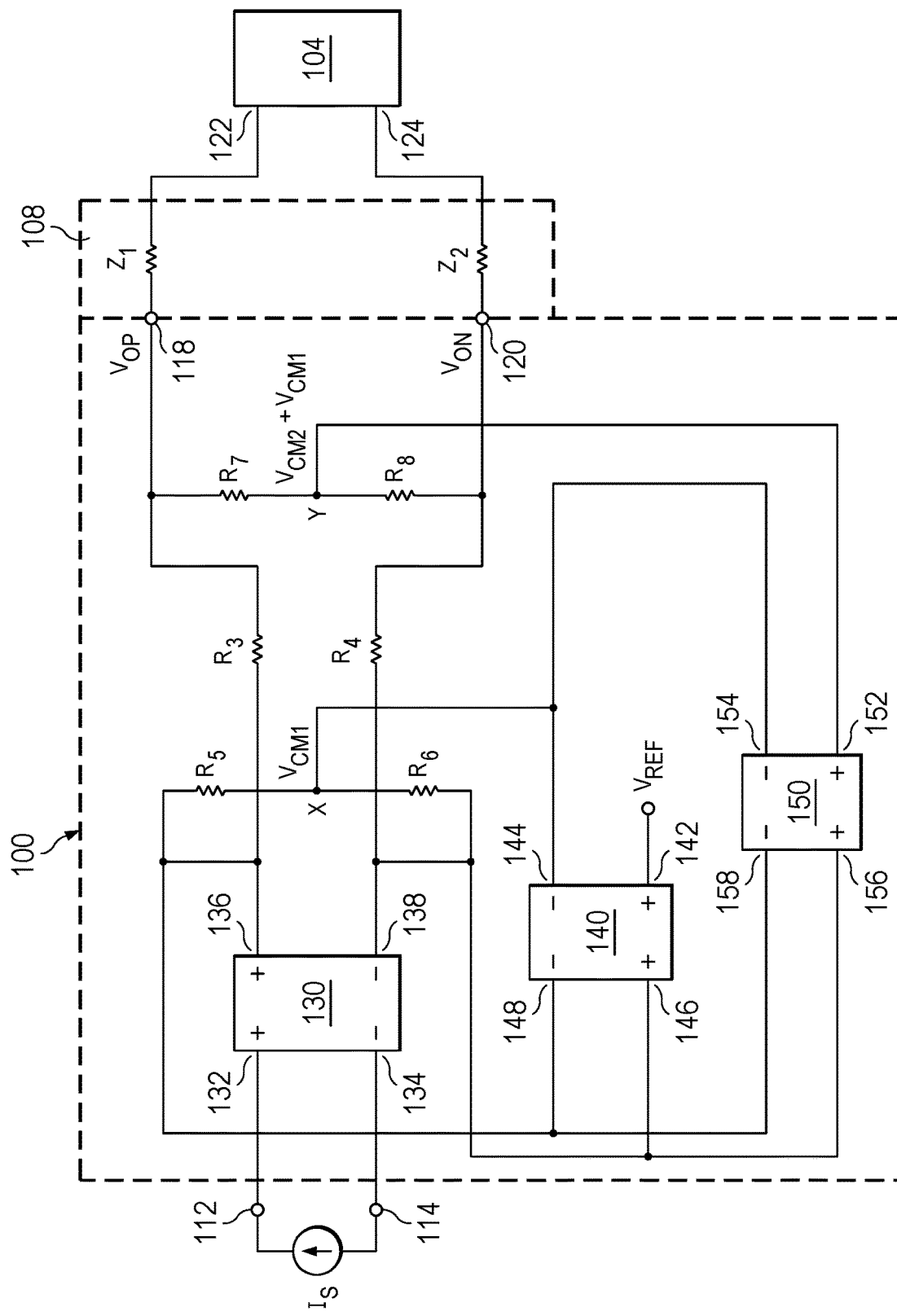
FIG. 1A illustrates a schematic diagram of a driver system of an example embodiment.

FIG. 1A illustrates a schematic diagram of driver system 100 of an example embodiment. Driver system 100 is coupled to receiving device 104 (e.g., computer, logic circuit, communication device) by transmission line 108 (e.g., twisted pair cable, two-wire line, circuit board traces, etc.). Transmission line 108 acts as a load which couples driver system 100 to receiving device 104. Driver system 100 drives the load (e.g., transmission line 108) to transmit signals to receiving device 104. In some example embodiments, transmission line 108 is a two-wire differential signal path. Driver system 100 enables high speed communication between a transmitting device and a receiving device. Driver system 100 may be used in, for example, audio systems, ethernet systems, automotive systems, industrial systems and communication and networking systems. In some example embodiments, driver system 100 is implemented in an integrated circuit (IC) or a semiconductor die.

Driver system 100 includes non-inverting system input 112 and inverting system input 114. Input signal source Is may be coupled between non-inverting system input 112 and inverting system input 114. In some example embodiments, input signal source Is may, for example, be a digital-to-analog converter (DAC) or a current source which provides an input current that may toggle between +I (e.g., around +100 micro-amperes) and −I (e.g., around −100 micro-amperes).

Driver system 100 includes non-inverting system output 118 and inverting system output 120. Transmission line 108 may be represented by two impedances $Z_1$ and $Z_2$. Impedance $Z_1$ (e.g., around 50 ohms, also referred to as a characteristic impedance) is coupled between non-inverting system output 118 and receiving device input 122, and impedance $Z_2$ (e.g., around 50 ohms, also referred to as a characteristic impedance) is coupled between inverting system output 120 and receiving device input 124.

Figure 1B:
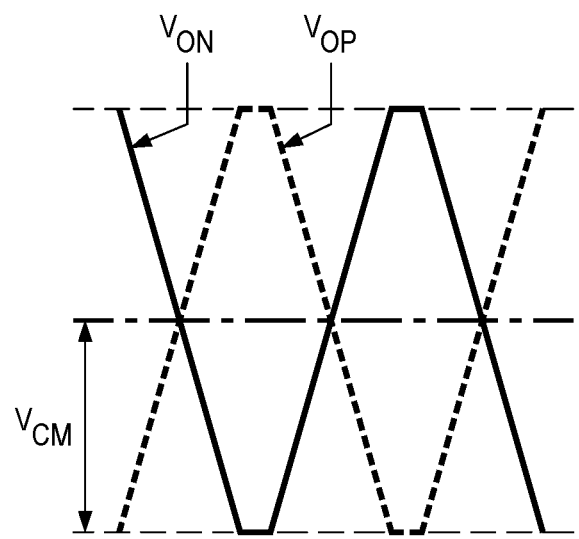
FIG. 1B illustrates a differential signal generated by the driver system of FIG. 1A.

Driver system 100 drives a differential signal (illustrated in FIG. 1B) over transmission line 108. The differential signal includes two complementary signals: a voltage $V_{OP}$, also referred to as a non-inverting output signal, at non-inverting system output 118; and a voltage $V_{ON}$, also referred to as an inverting output signal, at inverting system output 120. The voltages $V_{OP}$ and $V_{ON}$ are balanced because they have equal amplitude and opposite polarity relative to a common mode voltage $V_{CM}$.

Driver system 100 includes line driver 130 which includes non-inverting driver input 132 coupled to non-inverting system input 112 and includes inverting driver input 134 coupled to inverting system input 114. Line driver 130 includes non-inverting driver output 136 coupled to non-inverting system output 118 via termination resistor $R_3$ (e.g., around 50 ohms) and includes inverting driver output 138 coupled to inverting system output 120 via termination resistor $R_4$ (e.g., around 50 ohms). In some example embodiments, line driver 100 may be an amplifier circuit used to extend the transmission distance between a transmitting device and a receiving device connected over a transmission line. To maximize power transfer to receiving device 104 and minimize signal reflections from receiving device 104, the impedance of $R_3$ is matched with the impedance of $Z_1$ of transmission line 108, and the impedance of $R_4$ is matched with the impedance of $Z_2$ of transmission line 108.

Driver system 100 includes first amplifier stage 140 which includes non-inverting input 142 adapted to be coupled to a reference voltage source V REF (e.g., around 1.65V). First amplifier stage 140 includes inverting input 144 coupled to sense a first common mode voltage $V_{CM1}$ (also referred to as first common mode noise) which may be present between non-inverting driver output 136 and inverting driver output 138. The first common mode voltage $V_{CM1}$ may be caused by a mismatch or an asymmetry between termination resistors $R_3$ and $R_4$ and any asymmetry of rise and fall times of differential signals generated by line driver 130.

In some example embodiments, resistors $R_5$ (e.g., around 1 k ohms) and $R_6$ (e.g., around 1 k ohms) are coupled between non-inverting driver output 136 and inverting driver output 138, and $R_5$ and $R_6$ are interconnected at node X. Inverting input 144 of first stage amplifier 140 is coupled to node X, thus coupling inverting input 144 to sense the first common mode voltage $V_{CM1}$. First amplifier stage 140 includes non-inverting output 146 coupled to inverting driver output 138 and includes inverting output 148 coupled to non-inverting driver output 136.

In some example embodiments, first amplifier stage 140 is a differential amplifier with a low unity-gain bandwidth (UGB). The UGB of first amplifier stage 140 is the frequency of an input signal at which the open-loop gain is equal to 1. The open-loop gain is defined as the maximum gain of an amplifier when there are no feedback loops present. Because first amplifier stage 140 has a low UGB, its amplification is limited only in DC domain.

Due to a feedback loop formed by first amplifier stage 140 from node X to driver outputs (e.g., non-inverting driver output 136 and inverting driver output 138), the DC voltage at inverting input 144 is approximately equal to the DC voltage at non-inverting input 142. Because first amplifier stage 140 has a low UGB, first amplifier only applies a DC bias to node X. As such, the DC voltage at node X is biased to be approximately equal to $V_{REF}$ (e.g., around 1.65V).

Driver system 100 includes second amplifier stage 150 which includes non-inverting input 152 coupled to sense a second common mode voltage which may be present between non-inverting system output 118 and inverting system output 120. The second common mode voltage (also referred to as second common mode noise) is approximately equal to the sum of the first common mode voltage $V_{CM1}$ and an additional common mode voltage $V_{CM2}$. This additional common mode voltage $V_{CM2}$ (e.g., at around 50 MHz to around 1.3 GHz) may be caused by any mismatch or asymmetry in transmission line 108 (e.g., asymmetry between $Z_1$ and $Z_2$).

In some example embodiments, resistors $R_7$ (e.g., around 1 k ohms) and $R_8$ (e.g., around 1 k ohms) are coupled between non-inverting system output 118 and inverting system output 120, and $R_7$ and $R_8$ are interconnected at node Y. Non-inverting input 152 of second amplifier stage 150 is coupled to node Y, thus coupling non-inverting input 152 to sense the second common mode voltage (e.g., $V_{CM1}+V_{CM2}$). Second amplifier stage 150 includes inverting input 154 coupled to node X. As such, the first common mode voltage $V_{CM1}$ is applied to inverting input 154 of second amplifier stage 150, and the second common mode voltage (e.g., $V_{CM1}+V_{CM2}$) is applied to non-inverting input 152 of second amplifier stage 150. Second amplifier stage 150 includes non-inverting output 156 which is AC-coupled (not shown in FIG. 1A) to inverting driver output 138, and second amplifier stage 150 includes inverting output 158 which is AC-coupled (not shown in FIG. 1A) to non-inverting driver output 136. Here, the term "AC-coupled" may generally refer to a coupling or a connection through which AC signals may pass but DC signals are blocked. As such, AC signals from non-inverting output 156 of second amplifier stage 150 may flow to inverting driver output 138 but DC signals are blocked. Also, AC signals from inverting output 158 of second amplifier stage 150 may flow to non-inverting driver output 136 but DC signals are blocked.

In some example embodiments, second amplifier stage 150 is a differential amplifier with a high unity-gain bandwidth (UGB). The UGB of second amplifier stage 150 is the frequency of an input signal at which the open-loop gain is equal to 1. Due to a feedback loop formed by second amplifier stage 150 from node X and node Y to driver outputs (e.g., non-inverting driver output 136 and inverting driver output 138), AC voltages at non-inverting input 152 and inverting input 154 are approximately equal (e.g., voltage at node X is approximately equal to voltage at node Y). As such, the first common mode voltage $V_{CM1}$ and the second common mode voltage (e.g., $V_{CM1}+V_{CM2}$) are approximately equal. Because the first common mode voltage $V_{CM1}$ and the second common mode voltage (e.g., $V_{CM1}+V_{CM2}$) are approximately equal, the common mode noise $V_{CM2}$ which is caused by a mismatch in transmission line 108 is minimized (e.g., $V_{CM2}$ approaches near zero value).

Figure 2:
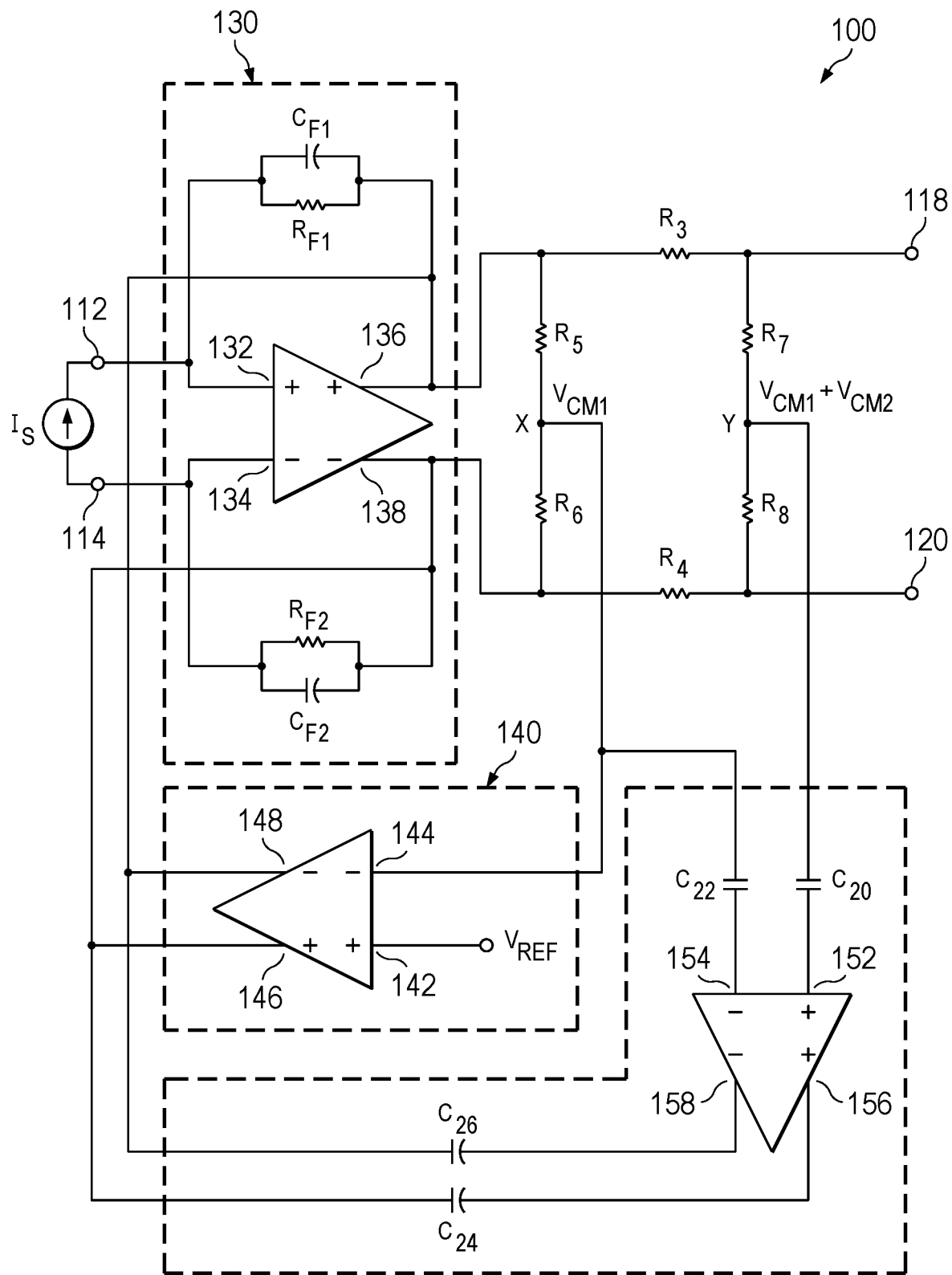
FIG. 2 illustrates a schematic diagram of an example implementation of the driver system of FIG. 1A.

FIG. 2 illustrates a schematic diagram of an implementation of driver system 100 of an example embodiment. Portions of driver system 100 of FIG. 1A are the same as driver system 100 of FIG. 2. As such, these similar features share the same reference numbers in FIGS. 1A and 2.

Line driver 130 includes first feedback resistor $R_{F1}$ (e.g., around 2 k ohms) coupled between non-inverting input 132 and non-inverting output 136 and includes first feedback capacitor $C_{F1}$ (e.g., around 0.39 pF) coupled in parallel with RH. Line driver 130 includes second feedback resistor $R_{F2}$ (e.g., around 2 k ohms) coupled between inverting input 134 and inverting output 138 and includes second feedback capacitor $C_{F2}$ (e.g., around 0.39 pF) coupled in parallel with $R_{F2}$. The parallel combination of $R_{F1}\|C_{F1}$ and the parallel combination of $R_{F2}\|C_{F2}$ set a corner frequency (e.g., −3 dB point) of line driver 130. Here, the term "corner frequency" or "cutoff frequency" may generally refer to a boundary in a system's frequency response at which energy flowing through the system begins to be attenuated or reduced (e.g., by 3 dB). At low frequencies $C_{F1}$ and $C_{F2}$ act as open circuits (e.g., $C_{F1}$ and $C_{F2}$ have high impedances), and as such the DC gain of line driver 130 is set by $R_{F1}$ and $R_{F2}$. First amplifier stage 140 includes non-inverting input 142 adapted to be coupled to the reference voltage $V_{REF}$ (e.g., around 1.65V) and includes inverting input 144 coupled to node X. First amplifier stage 140 includes non-inverting output 146 coupled to inverting output 138 of line driver 130 and includes inverting output 148 coupled to non-inverting output 136 of line driver 130. As such, first amplifier stage 140 forms a feedback loop which biases the DC voltage at node X to $V_{REF}$ (e.g., around 1.65V). Since node X is biased to $V_{REF}$, non-inverting driver output 136 and inverting driver output 138 are biased to approximately $V_{REF}$.

Second amplifier stage 150 is configured to sense the first common mode voltage $V_{CM1}$ and the second common mode voltage (e.g., $V_{CM1}+V_{CM2}$). Because second amplifier stage 150 has a high UGB, it minimizes any difference between the first and second common mode voltages by a feedback mechanism.

Because the DC voltage level at node X is biased by first amplifier stage 140, it is desirable that the DC voltage level at node X is unaffected by second amplifier stage 150. In order to prevent second amplifier stage 150 from biasing node X, first coupling capacitor $C_{20}$ (e.g., around 25 pF) is coupled between non-inverting input 152 of second amplifier stage 150 and node Y, and second coupling capacitor $C_{22}$ (e.g., around 25 pF) is coupled between inverting input 154 of second amplifier stage 150 and node X. Third coupling capacitor $C_{24}$ (e.g., around 25 pF) is coupled between non-inverting output 156 of second amplifier stage 150 and inverting output 138 of line driver 130, and fourth coupling capacitor $C_{26}$ (e.g., around 25 pF) is coupled between inverting output 158 of second amplifier stage 150 and non-inverting output 136 of line driver 130. Because capacitors $C_{20}$ and $C_{22}$ have high impedances at low frequencies, capacitors $C_{20}$ and $C_{22}$ block DC voltages from nodes X and Y from being coupled to the respective inverting and non-inverting inputs, 154 and 152. However, capacitors $C_{20}$ and $C_{22}$ have low impedances at high frequencies, thus allowing the first common mode voltage $V_{CM1}$ to be coupled to inverting input 154 and the second common mode voltage (e.g., $V_{CM1}+V_{CM2}$) to be coupled to non-inverting input 152. Likewise, capacitors $C_{24}$ and $C_{26}$ have high impedances at low frequencies. Hence, capacitors $C_{24}$ and $C_{26}$ block DC voltages from non-inverting output 146 and inverting output 148 from biasing the DC voltage at node X but allow AC signals from second amplifier stage 150, which has a high UGB, to modulate the first common mode voltage $V_{CM1}$ and the second common mode voltage (e.g., $V_{CM1}+V_{CM2}$). Because of the feedback loop formed by second amplifier stage 150, the first common mode voltage $V_{CM1}$ is approximately equal to the second common mode (e.g., $V_{CM1}+V_{CM2}$). As such $V_{CM2}$, which represents the common mode noise generated due to any mismatch or asymmetry of transmission line 108, is minimized.

Figure 3:
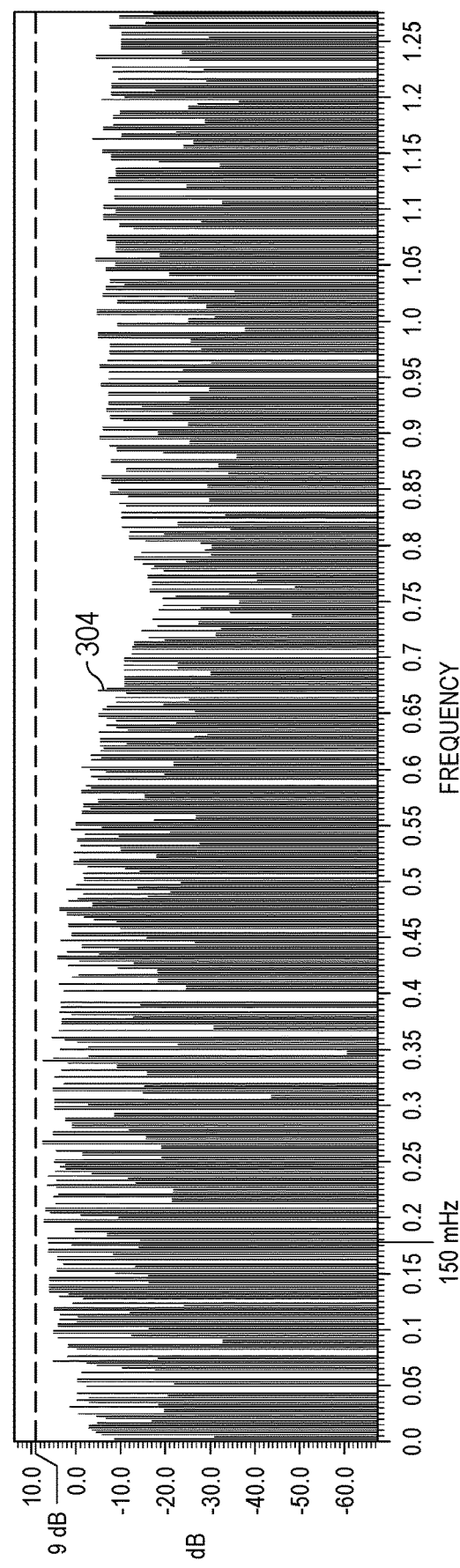
FIG. 3 illustrates a simulated plot of an electromagnetic interference (EMI) due to common mode noise in the driver system of FIG. 2.

FIG. 3 illustrates a simulated plot 304 of an electromagnetic interference (EMI) due to common mode noise at system outputs (e.g., non-inverting system output 118 and inverting system output 120) in driver system 100. The y-axis represents EMI in units of dB and the x-axis represents frequency in units of GHz. In this example, the EMI is around 7.19 dB at around 0.158 GHz. The EMI is generated due to a 2.5% mismatch or asymmetry of transmission line 104 (e.g., 2.5% mismatch between $Z_1$ and $Z_2$). Thus, the EMI of driver system 100 is below the EMC compliance standard (e.g., 9 dB).

In some example embodiments, driver system 100, which is illustrated in FIG. 2, may be implemented in an IC or a semiconductor die. An advantage of implementing driver system 100 in an IC or a semiconductor die is that any common mode noise due to a mismatch or asymmetry of transmission line 108 may be suppressed by the IC or the semiconductor die without the need to add external common mode chokes or improved shielding.

The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drainextended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value, or, if the value is zero, a reasonable range of values around zero.

What is claimed is:

1. A driver system comprising:
    a line driver comprising:
        a first input;
        a second input;
        a first output; and
        a second output;
    a first termination resistor having a first terminal and second terminal, the first terminal of the first termination resistor coupled to the second output of the line driver;
    a second termination resistor having a first terminal and second terminal, the first terminal of the second termination resistor coupled to the first output of the line driver;
    a first amplifier stage coupled to the line driver wherein the first amplifier applies a DC voltage across the second output of the line driver and the first output of the line driver; and
    a second amplifier stage AC-coupled to the second terminal of the first termination resistor and the second terminal of the second termination resistor;
    wherein the first amplifier stage comprises:
        a first input coupled to the first output of the line driver and the the second output of the line driver; and
        a non-inverting second input adapted to be coupled to a reference first voltage.

2. A driver system comprising:
    a line driver comprising:
        a first input;
        a second input;
        a first output; and
        a second output;
    a first termination resistor having a first terminal and second terminal, the first terminal of the first termination resistor coupled to the second output of the line driver;
    a second termination resistor having a first terminal and second terminal, the first terminal of the second termination resistor coupled to the first output of the line driver;
    a first amplifier stage coupled to the line driver wherein the first amplifier applies a DC voltage across the second output of the line driver and the first output of the line driver; and
    a second amplifier stage AC-coupled to the second terminal of the first termination resistor and the second terminal of the second termination resistor;
    wherein the first amplifier stage comprises:
        a first output coupled to the second output of the line driver; and
        a second output coupled to the first output of the line driver.

3. The driver system of claim 1, wherein the second amplifier stage comprises:
    a first input coupled to a first input of the first amplifier stage; and
    a second input coupled to the second output of the line driver and the first output of the line driver.

4. The driver system of claim 3, wherein the first input of the second amplifier stage is coupled to a first input of the first amplifier stage via a first capacitor, and wherein the second input of the second amplifier stage is coupled to the second terminal of the first termination resistor and the second terminal of the second termination resistor via a second capacitor.

5. The driver system of claim 1, wherein the second amplifier stage comprises:
    a first output coupled to the second output of the line driver; and
    a second output coupled to the first output of the line driver.

6. The driver system of claim 5, wherein the first output of the second amplifier stage is coupled to the second output of the line driver via a third capacitor, and wherein the second output of the second amplifier stage is coupled to the first output of the line driver via a fourth capacitor.

7. The driver system of claim 1, further comprising:
    a first compensation capacitor coupled between the first input of the line driver and the second output of the line driver; and
    a second compensation capacitor coupled between the of the line driver input of the line driver and the first output of the line driver.

8. The driver system of claim 1, further comprising:
    a first compensation resistor coupled between the first input of the line driver and the second output of the line driver; and
    a second compensation resistor coupled between the of the line driver input of the line driver and the first output of the line driver.

9. The driver system of claim 1, wherein the first amplifier stage has a low bandwidth.

10. The driver system of claim 1, wherein the second amplifier stage has a high bandwidth.

11. A driver system comprising:
    a line driver comprising:
        a first input;
        a second input;
        a first output; and
        a second output;

a first termination resistor having a first terminal and second terminal, the first terminal of the first termination resistor coupled to the second output of the line driver;

a second termination resistor having a first terminal and second terminal, the first terminal of the second termination resistor coupled to the first output of the line driver;

a first amplifier stage coupled to the line driver wherein the first amplifier applies a DC voltage across the second output of the line driver and the first output of the line driver; and a second amplifier stage coupled to the line driver, the second amplifier stage configured to minimize a voltage difference between a first common mode voltage and a second common mode voltage, the first common mode voltage is a voltage across the second output of the line driver and the first output of the line driver and the second common mode voltage is a voltage across the second terminal of the first termination resistor and the second terminal of the second termination resistor.

12. The driver system of claim 11, wherein the second amplifier stage comprises:
   a first input coupled to the second terminal of the first termination resistor and the second terminal of the second termination resistor via a first capacitor; and
   a second input coupled to the second output of the line driver and first output of the line driver via a second capacitor.

13. The driver system of claim 11, wherein the second amplifier stage comprises:
   a first output coupled to the first output of the line driver via a third capacitor; and
   a second output coupled to the second output of the line driver via a fourth capacitor.

14. The driver system of claim 11, wherein the first amplifier stage comprises:
   a first input coupled to a voltage source; and
   a second input coupled to the second output of the line driver and the first output of the line driver.

15. The driver system of claim 11, wherein the first amplifier stage comprises:
   a first output coupled to the first output of the line driver; and
   a second output coupled to the second output of the line driver.

16. A driver system comprising:
   a line driver comprising:
      a non-inverting driver first input;
      a second input;
      a first output; and
      a second output;
   a first termination resistor having a first terminal and second terminal, the first terminal of the first termination resistor coupled to the second output of the line driver;
   a second termination resistor having a first terminal and second terminal, the first terminal of the second termination resistor coupled to the first output of the line driver;
   a first amplifier stage comprising:
      a first input coupled to a voltage;
      a second input coupled to the second output of the line driver and the first output of the line driver;
      a first output coupled to the first output of the line driver; and
      a second output coupled to the second output of the line driver; and
   a second amplifier stage comprising:
      a first input coupled to the second terminal of the first termination resistor and the second terminal of the second termination resistor via a first capacitor;
      a second input coupled to the second output of the line driver and the first output of the line driver via a second capacitor;
      a first output coupled to the first output of the line driver via a third capacitor; and
      an inverting a second output coupled to the non-inverting driver second output of the line driver via a fourth capacitor.

17. The driver system of claim 16, wherein the first amplifier stage applies a DC voltage across the second output of the line driver and the first output of the line driver.

18. The driver system of claim 16, wherein the second amplifier stage is configured to minimize a voltage difference between a first common mode voltage and a second common mode voltage, the first common mode voltage is a voltage across the second output of the line driver and the first output of the line driver and the second common mode voltage is a voltage across the second terminal of the first termination resistor and the second terminal of the second termination resistor.

* * * * *